(12) United States Patent
Yang et al.

(10) Patent No.: US 11,996,440 B2
(45) Date of Patent: May 28, 2024

(54) CAPACITOR ARRAY, METHOD FOR MANUFACTURING THE SAME AND MEMORY

(71) Applicant: CHANGXIN MEMORY TECHNOLOGIES, INC., Hefei (CN)

(72) Inventors: Xiaoyu Yang, Hefei (CN); Liang Zhao, Hefei (CN)

(73) Assignee: Changxin Memory Technologies, Inc., Hefei (CN)

(*) Notice: Subject to any disclaimer, the term of this patent is extended or adjusted under 35 U.S.C. 154(b) by 378 days.

(21) Appl. No.: 17/455,777

(22) Filed: Nov. 19, 2021

(65) Prior Publication Data
US 2022/0302249 A1 Sep. 22, 2022

Related U.S. Application Data

(63) Continuation of application No. PCT/CN2021/101692, filed on Jun. 23, 2021.

(30) Foreign Application Priority Data

Mar. 17, 2021 (CN) .......................... 202110285072.5

(51) Int. Cl.
*H01L 23/52* (2006.01)
*H01L 49/02* (2006.01)
*H10B 12/00* (2023.01)

(52) U.S. Cl.
CPC .............. *H01L 28/92* (2013.01); *H01L 28/91* (2013.01); *H10B 12/03* (2023.02); *H10B 12/30* (2023.02)

(58) Field of Classification Search
CPC ......... H01L 28/92; H01L 28/91; H01L 28/90; H10B 12/03; H10B 12/30; H10B 12/033
See application file for complete search history.

(56) References Cited

U.S. PATENT DOCUMENTS

2007/0032035 A1* 2/2007 Durcan ............... H10B 12/318
257/E21.648
2013/0115748 A1* 5/2013 Kim ...................... H01L 28/91
438/381

(Continued)

FOREIGN PATENT DOCUMENTS

CN 104037176 A 9/2014
CN 107731794 A 2/2018
(Continued)

OTHER PUBLICATIONS

First Office Action in CN202110285072.5 mailed Apr. 14, 2022, 15 pages.

(Continued)

*Primary Examiner* — S M Sohel Imtiaz
(74) *Attorney, Agent, or Firm* — Cooper Legal Group, LLC

(57) ABSTRACT

The present disclosure provides a method for manufacturing capacitor array, including: forming, on an upper surface of the substrate, a laminated structure including sacrificial layers and support layers; forming a patterned mask layer on an upper surface of the laminated structure; etching the laminated structure based on the patterned mask layer to form a through hole, wherein after the through hole is formed, the patterned mask layer is retained on the upper surface of the laminated structure, and the through hole penetrates through the patterned mask layer and the laminated structure; forming a first electrode on a sidewall and at a bottom of the through hole; forming, in the patterned mask layer and the laminated structure, and removing the sacrificial layer based on the opening; forming a capacitor dielectric layer on a surface of the first electrode; and forming a second electrode on a surface of the capacitor dielectric layer.

20 Claims, 5 Drawing Sheets

(56) References Cited

U.S. PATENT DOCUMENTS

| | | | |
|---|---|---|---|
| 2014/0252545 A1* | 9/2014 | Yu | H01L 28/91 |
| | | | 257/532 |
| 2017/0250243 A1* | 8/2017 | Lee | H01L 28/60 |
| 2019/0348417 A1* | 11/2019 | Yokoyama | H10B 12/033 |
| 2021/0151554 A1* | 5/2021 | Hsiao | H01L 21/3213 |
| 2021/0335789 A1* | 10/2021 | Zhu | H01L 29/78642 |
| 2022/0189957 A1* | 6/2022 | Atanasov | H01L 29/24 |

FOREIGN PATENT DOCUMENTS

| | | |
|---|---|---|
| CN | 108550569 A | 9/2018 |
| CN | 208521929 U | 2/2019 |
| CN | 110731013 A | 1/2020 |
| CN | 111668188 A | 9/2020 |
| CN | 111755517 A | 10/2020 |
| CN | 111834529 A | 10/2020 |
| CN | 112951768 A | 6/2021 |

OTHER PUBLICATIONS

International Search Report as cited in PCT/CN2021/101692 mailed Nov. 25, 2021, 9 pages.

* cited by examiner

CAPACITOR ARRAY, METHOD FOR MANUFACTURING THE SAME AND MEMORY

CROSS-REFERENCE TO RELATED APPLICATIONS

This application is a continuation application of International Patent Application No. PCT/CN2021/101692, filed on Jun. 23, 2021, which claims priority to Chinese Patent Application No. 202110285072.5, filed with the Chinese Patent Office on Mar. 17, 2021 and entitled "CAPACITOR ARRAY, METHOD FOR MANUFACTURING THE SAME AND MEMORY." International Patent Application No. PCT/CN2021/101692 and Chinese Patent Application No. 202110285072.5 are incorporated herein by reference in their entireties.

TECHNICAL FIELD

The present disclosure relates to the technical field of methods for manufacturing semiconductor devices, and in particular to a capacitor array, a method for manufacturing the same, and a memory.

BACKGROUND

A dynamic random-access memory (DRAM) includes a capacitor used for storing electric charges and a transistor connected to the capacitor. The DRAM stores data in the form of electric charges on the capacitor, which needs to be charged and discharged regularly every few milliseconds. The larger capacitance of the capacitor is, the longer the data stored in the DRAM can be retained.

When a capacitor in a DRAM is manufactured by using a conventional process, after a capacitance hole is formed through capacitance etching (CAP EH), a polysilicon layer of about 200 nm still exists at the top of an upper support layer of the capacitor and needs to be removed by performing steps such as etching and cleaning, resulting in problems such as that a process difficulty is high, and a manufactured capacitor has poor structural stability and small capacitance.

SUMMARY

Based on this, it is necessary to provide a novel capacitor array and a method for manufacturing the same, to solve problems that a conventional process is highly difficult, and a manufactured capacitor structure has poor structural stability and a smaller capacitance.

A first aspect of the present disclosure provides a method for manufacturing a capacitor array, including: providing a substrate; forming, on an upper surface of the substrate, a laminated structure including sacrificial layers and support layers that are alternately laminated; forming a patterned mask layer on an upper surface of the laminated structure; etching the laminated structure based on the patterned mask layer to form a through hole; after the through hole is formed, the patterned mask layer with a preset thickness is retained on the upper surface of the laminated structure, and the through hole at least penetrates through the patterned mask layer with the preset thickness and the laminated structure in a thickness direction; forming a first electrode on a sidewall and at a bottom of the through hole; forming, in the patterned mask layer with the preset thickness and the laminated structure, an opening that exposes the sacrificial layer, and removing the sacrificial layer based on the opening; forming a capacitor dielectric layer on a surface of the first electrode; and forming a second electrode on a surface of the capacitor dielectric layer.

A second aspect of the present disclosure provides a capacitor array, including: a substrate; a support structure disposed on the substrate; the support structure includes a support layer and a patterned mask layer with a preset thickness disposed on an upper surface of the support layer; a first electrode disposed in the support structure; a capacitor dielectric layer covering exposed surfaces of the first electrode and the support structure; and a second electrode covering the surface of the capacitor dielectric layer.

A third aspect of the present disclosure provides a memory, including the capacitor array provided in any one of the foregoing aspects.

According to the method for manufacturing a capacitor array, the patterned mask layer with the preset thickness that would otherwise need to be removed is used as an additional support layer of the capacitor structure. Therefore, removing the patterned mask layer through etching is eliminated to lower a process difficulty, and stability of the capacitor structure is improved to prevent the capacitor structure from being stripped. In addition, the added patterned mask layer with the preset thickness can further increase a height and a capacitance of the capacitor.

Figure 1:
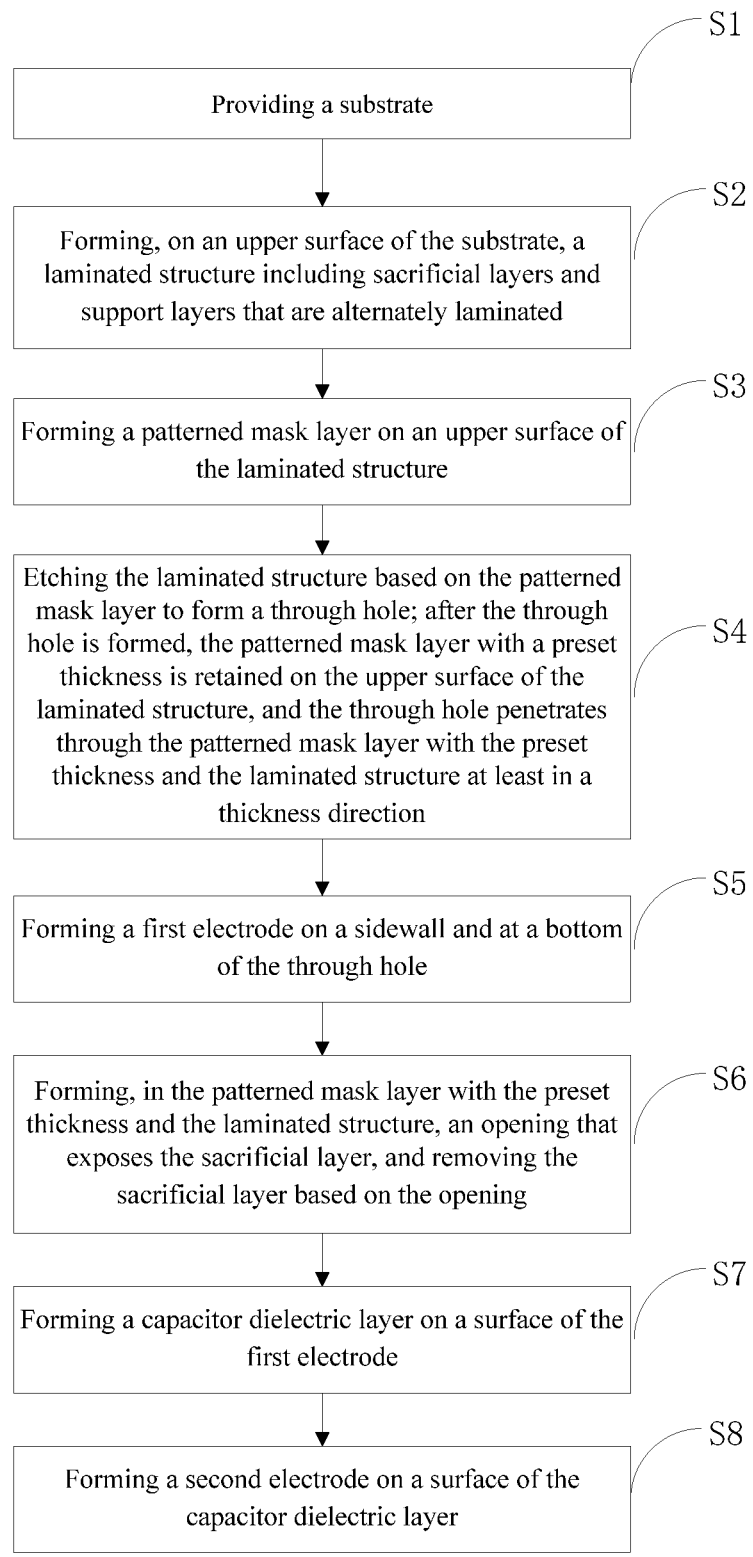
FIG. 1 is a schematic flowchart of a method for manufacturing a capacitor array according to an embodiment of the present disclosure.

Reference numerals in the accompanying drawings are as follows: 21—substrate; 22—sacrificial layers; 221—first sacrificial layer; 222—second sacrificial layer; 23—support layers; 231—first support layer; 232—second support layer; 233—third support layer; 241—patterned mask layer; 242—patterned mask layer with a preset thickness; 25—through hole; 26—first electrode; 27—capacitor dielectric layer; and 28—second electrode.

DESCRIPTION OF EMBODIMENTS

For ease of understanding, the following describes the present disclosure more comprehensively with reference to related accompanying drawings. Optional embodiments of the present disclosure are shown in the accompanying drawings. However, the present disclosure may be implemented in many different forms, and is not limited to the embodiments described in the present disclosure. On the contrary, these embodiments are provided for a more thorough and comprehensive understanding of content disclosed in the present disclosure.

Unless otherwise defined, all terms (including technical and scientific terms) used herein have the same meanings as those commonly understood by people of ordinary skill in the art to which the present disclosure belongs. The terms used in the specification of the present disclosure are only for describing specific embodiments, and are not intended to limit the present disclosure. The term "and/or" as used herein includes any or all combinations of one or more of relevant listed items.

Unless otherwise specified, in description of position relationships, when an element such as a layer, film, or substrate is "on" another film, it may be directly on the another film or there may be an intermediate layer. Further, when a layer is "under" another layer, it may be directly under the another layer, and there may be one or more intermediate layers. It may also be understood that when a layer is "between" two layers, it may be a unique layer between the two layers, or there may be one or more intermediate layers.

Unless clearly defined terms such as "only", "consisting of", and the like are used, "including", "having" and "comprising" described in the present disclosure indicate that another component may be added. Unless otherwise described, a term of a singular form may indicate a plural form, and it shall not be understood that the number is one.

For clear and complete description of the foregoing technical solutions of the present disclosure, the following explanation is made with reference to specific embodiments.

As shown in FIG. 1, an embodiment of the present disclosure provides a method for manufacturing a capacitor array, including the following steps.

In S1, a substrate is provided.

In S2, a laminated structure including sacrificial layers and support layers that are alternately laminated is formed on an upper surface of the substrate.

In S3, a patterned mask layer is formed on an upper surface of the laminated structure.

In S4, the laminated structure is etched based on the patterned mask layer to form a through hole. After the through hole is formed, the patterned mask layer with a preset thickness is retained on the upper surface of the laminated structure, and the through hole at least penetrates through the patterned mask layer with the preset thickness and the laminated structure in a thickness direction.

In S5, a first electrode is formed on a sidewall and at a bottom of the through hole.

In S6, an opening that exposes the sacrificial layer is formed in the patterned mask layer with the preset thickness and the laminated structure, and the sacrificial layer is removed based on the opening.

In S7, a capacitor dielectric layer is formed on a surface of the first electrode.

In S8, a second electrode is formed on a surface of the capacitor dielectric layer.

According to the method for manufacturing a capacitor array, the patterned mask layer with the preset thickness that would otherwise needs to be removed is used as an additional support layer of the capacitor structure. Therefore, removing the patterned mask layer through etching is omitted to reduce the process difficulty, and the stability of the capacitor structure is further improved to prevent the capacitor structure from being stripped. In addition, the added patterned mask layer with the preset thickness can further increase a height and a capacitance of the capacitor.

In step S1, a memory array structure including a plurality of pads is formed in the substrate. The memory array structure further includes transistor word lines and bit lines. The pads are electrically connected to a transistor source in the memory array structure. For example, the pads may be arranged in the shape of a hexagonal array. However, the arrangement is not limited to this, and corresponds to that of a subsequently manufactured integrated-circuit capacitor. Specifically, the pads are isolated from each other through spacer layers. The spacer layer may be made of any one or a combination of more than two of silicon nitride (SiN), silicon oxide ($SiO_2$), and aluminum oxide ($Al_2O_3$). In this embodiment, the spacer layer may be made of SiN.

In step S2, the sacrificial layer refers to a material layer that is to be removed in a subsequent step and is mainly used to temporarily support other functional layers in the manufacturing process, so as to facilitate structure construction. When the functional layers no longer need to rely on the sacrificial layer or the sacrificial layer hinders a further manufacturing process, the sacrificial layer can be removed to facilitate the subsequent process. In this embodiment, for example, the sacrificial layer may be made of silicon oxide.

The support layer refers to a functional layer providing support in a capacitor array. The stability of a structure of the capacitor array directly depends on that of the support layer. For example, the support layer may be made of silicon nitride or silicon carbonitride.

Figure 2:
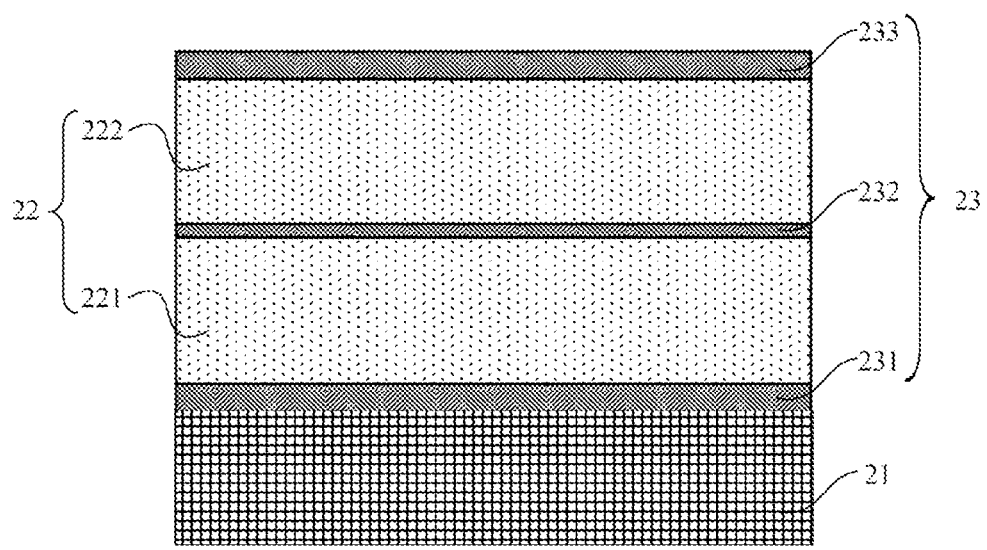
FIG. 2 is a schematic structural diagram of a partial cross section of sacrificial layers and support layers that are alternately laminated according to an embodiment of the present disclosure.

In an embodiment, the laminated structure is as shown in FIG. 2. Forming the laminated structure includes the following steps:

In S21, a first support layer 231 is formed on the upper surface of the substrate 21.

In S22, a first sacrificial layer 221 is formed on an upper surface of the first support layer 231.

In S23, a second support layer 232 is formed on an upper surface of the first sacrificial layer 221.

In S24, a second sacrificial layer 222 is formed on an upper surface of the second support layer 232.

In S25, a third support layer 233 is formed on an upper surface of the second sacrificial layer 222.

For example, the first sacrificial layer 221, the second sacrificial layer 222, the first support layer 231, the second support layer 232 and the third support layer 233 may be formed through atomic layer deposition or chemical vapor deposition. For example, the first sacrificial layer 221 and the second sacrificial layer 222 may be silicon oxide layers. The first support layer 231, the second support layer 232 and the third support layer 233 may be silicon nitride layers or silicon carbonitride layers.

For example, a thickness of the third support layer 233 is greater than those of the first support layer 231 and the second support layer 232. For example, the thickness of the third support layer 233 may range from 200 nm to 300 nm. Specifically, the thickness of the third support layer 233 may be 200 nm, 250 nm, 300 nm, or the like. The thickness of the second support layer 232 may range from 10 nm to 50 nm. Specifically, the thickness of the second support layer 232 may be 10 nm, 20 nm, 30 nm, 40 nm, 50 nm, or the like. The thickness of the first support layer 231 may range from 10 nm to 20 nm. Specifically, the thickness of the first support layer 231 may be 10 nm, 15 nm, or 20 nm. The thickness of the first sacrificial layer 221 may range from 200 nm to 500 nm. Specifically, the thickness of the first sacrificial layer 221 may be 200 nm, 300 nm, 400 nm, or 500 nm. The thickness of the second sacrificial layer 222 may range from 400 nm to 500 nm. Specifically, the thickness of the second sacrificial layer 222 may be 400 nm, 450 nm, or 500 nm.

Figure 3:
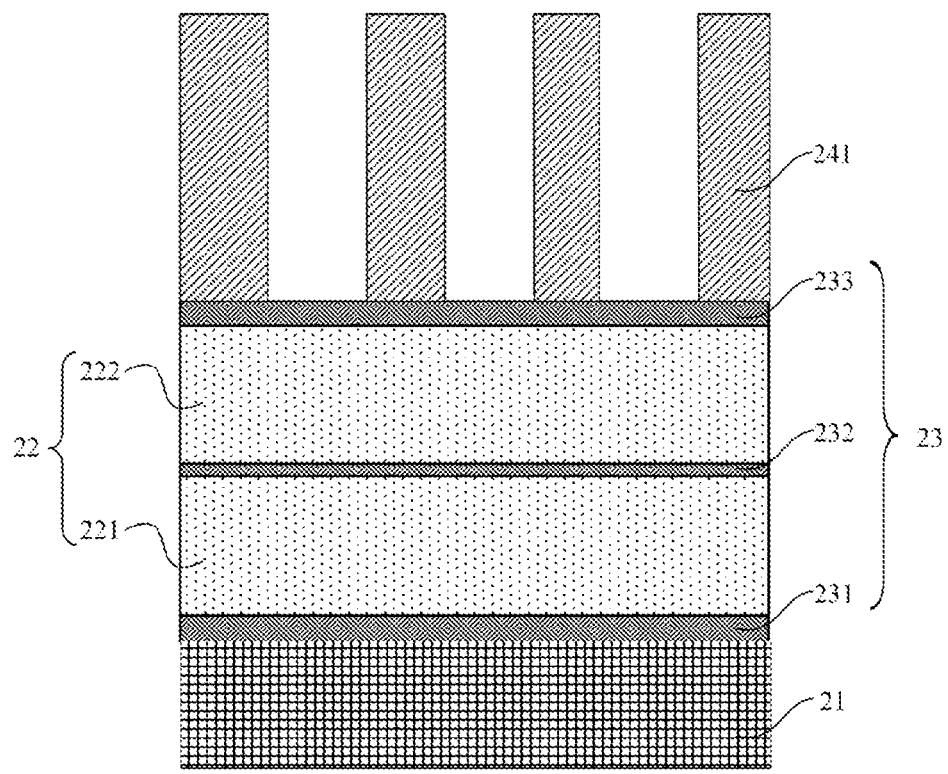
FIG. 3 is a schematic structural diagram of a partial cross section of a patterned mask layer according to an embodiment of the present disclosure.

In step S3, as shown in FIG. 3, the patterned mask layer 241 needs to be formed on the upper surface of the laminated structure to form the through hole 25 in the laminated structure. An opening pattern (not shown) is formed in the patterned mask layer 241, and defines a shape and a position of the through hole 25.

For example, a mask layer and a photoresist layer are first formed on the upper surface of the laminated structure. Then, the photoresist layer is patterned by using a photo-etching technology, and the mask layer is etched based on the patterned photoresist layer to obtain the patterned mask layer 241 used for defining capacitance holes. It should be noted that the method further includes a step of removing the patterned photoresist layer after the patterned mask layer 241 is obtained.

Figure 4:
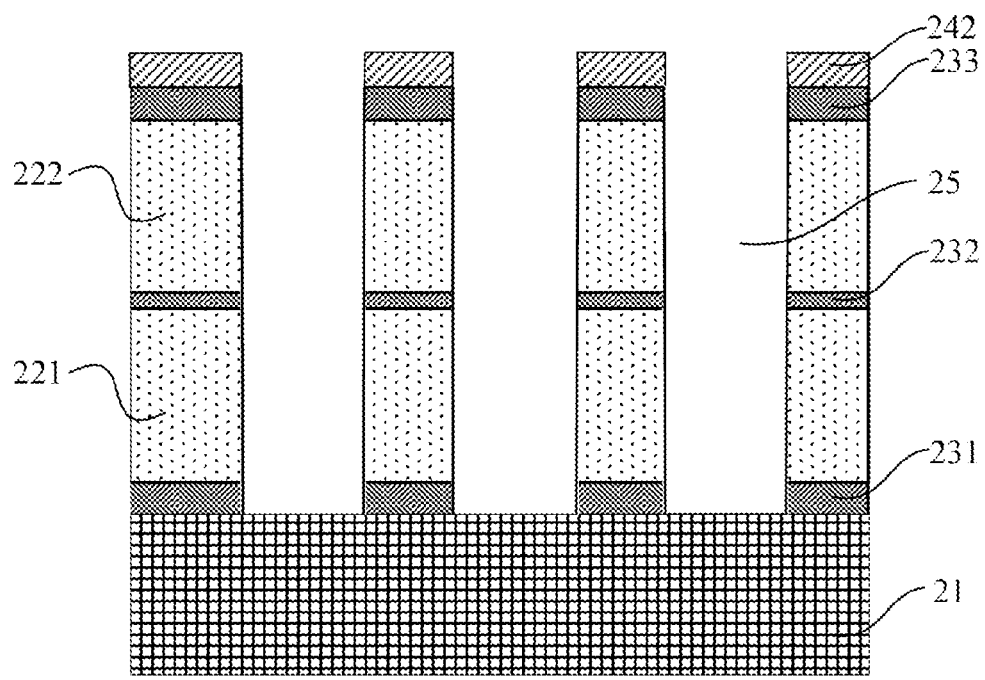
FIG. 4 is a schematic structural diagram of a partial cross section of a capacitance hole according to an embodiment of the present disclosure.

In step S4, as shown in FIG. 4, the laminated structure is etched based on the patterned mask layer 241 to form the through hole 25. The through hole 25 may be used as a capacitance hole in the capacitor array. After the through hole 25 is formed, a patterned mask layer 242 with a preset thickness is retained on the upper surface of the laminated structure. Specifically, a thickness of the patterned mask layer 242 with the preset thickness that is retained may be controlled by an etching selectivity ratio of an etching gas. This is because etching gases with different etching selectivity ratios have different etching speeds when being used to etch the patterned mask layer 241. Therefore, the thickness of the patterned mask layer 242 with the preset thickness can be selectively controlled by adjusting and controlling etching selectivity ratios of an etching gas on different materials.

For example, an etching selectivity ratio of an etching gas on the first support layer 231, the second support layer 232 and the third support layer 233 to the etching gas on the patterned mask layer 241 ranges from 3 to 5. Specifically, the etching selectivity ratio of an etching gas on the first support layer 231, the second support layer 232 and the third support layer 233 to the etching gas on the patterned mask layer 241 may be 3, 4, 5, or the like. An etching selectivity ratio of the etching gas on the first sacrificial layer 221 and the second sacrificial layer 222 to the etching gas on the patterned mask layer 241 is greater than 10. Specifically, the etching selectivity ratio of the etching gas on the first sacrificial layer 221 and the second sacrificial layer 222 to the etching gas on the patterned mask layer 241 may be 10.5, 11, 12, 13, or the like.

For example, the etching gas may be a mixed gas of a fluorine-containing gas and oxygen or a mixed gas of the fluorine-containing gas and hydrogen. The fluorine-containing gas may be one or more of the following: CF4, CHF3, C2F6, SF6 and C3F8. For example, the fluorine-containing gas may be CF4. When oxygen is added to CF4, part of the oxygen reacts with CF4 to generate fluoride ions, oxygen ions, carbon monoxide, carbon dioxide and the like. Oxygen ions may be absorbed on Si surfaces, affecting Si etching. As an oxygen content in the mixed gas increases, etching rates of the etching gas on the silicon oxide layer and the polysilicon layer increase in an initial phase (that is, when the oxygen content is relatively low) and has no much difference. However, when the oxygen content reaches a certain value, etching rates of the etching gas on the silicon oxide layer and the polysilicon layer decrease. For example, when the oxygen content (molar percentage) in the mixed gas reaches about 12%, the etching rate of the etching gas on the polysilicon layer begins to decrease. When the oxygen content in the mixed gas reaches about 20%, the etching rate of the etching gas on the silicon oxide layer begins to decrease. However, as the oxygen content in the mixed gas further increases, the etching rate of the mixed gas on the polysilicon layer decreases sharply, while that of the mixed gas on the silicon oxide layer decreases less, making a difference between the etching rates of the mixed gas on the polysilicon layer and the silicon oxide layer gradually increase.

Similarly, the fluorine-containing gas is CF4, for example. When hydrogen is added to CF4, fluoride ions react with hydrogen ions to generate hydrogen fluoride. CFx ions (x is less than or equal to 3) reacts with Si to generate SiF4 and C, and C may be absorbed on Si surfaces, affecting Si etching. As the hydrogen content in the mixed gas increases, etching rates of the etching gas on the silicon oxide layer and the polysilicon layer gradually decrease. However, etching rates of the etching gas on the polysilicon layer decreases faster, while that of the etching gas on the silicon oxide layer decreases slower, making a difference between the etching rates of the mixed gas on the polysilicon layer and the silicon oxide layer gradually increase.

The patterned mask layer 242 with the preset thickness is not removed, and is retained and supports the capacitor array together with the support layer 23 in S2. The process in this embodiment differs from a conventional one in that the patterned mask layer 242 with the preset thickness no longer needs to be etched and cleaned, reducing process steps and lowering the process difficulty. In addition, the patterned mask layer 242 with the preset thickness is retained, that is, a height of the capacitor array and a capacitance of the capacitor are increased.

For example, the patterned mask layer 242 is made of polysilicon. Polysilicon is hard and stable and has a good supporting effect. The stability of the capacitor structure can be improved by adding a polysilicon layer with a preset thickness on the upper surface of the third support layer 233 as an additional support layer.

For example, the preset thickness may range from 150 nm to 250 nm. Optionally, the preset thickness may be 150 nm, 170 nm, 190 nm, 200 nm, 210 nm, 230 nm or 250 nm.

Figure 5:
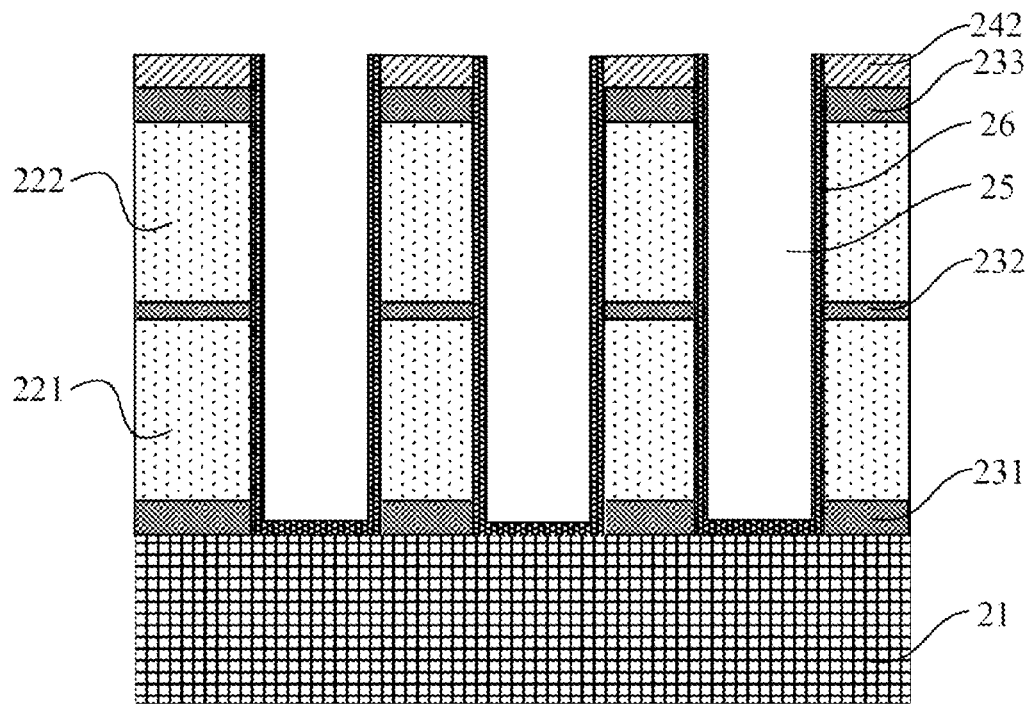
FIG. 5 is a schematic structural diagram of a partial cross section of a first electrode according to an embodiment of the present disclosure.

In step S5, as shown in FIG. 5, the first electrode 26 is formed on the sidewall and at the bottom of the through hole 25.

In an embodiment, forming the first electrode 26 on the sidewall and at the bottom of the through hole 25 includes the following steps.

In S51, the first electrode 26 with a certain thickness is deposited on a surface of an array structure as shown in FIG. 4, and covers the sidewall and the bottom of the through hole 25 and the upper surface of the patterned mask layer 242 (additional support layer) with the preset thickness.

For example, the first electrode 26 is deposited on the sidewall and at the bottom of the through hole 25 through atomic layer deposition or chemical vapor deposition. Preferably, the first electrode 26 includes a compound such as titanium nitride, titanium silicide, titanium silicide, or titanium nitride silicon (TiSixNy) that is formed by one or two of metal nitride and metal silicide.

In S52, the first electrode 26 on the upper surface of the additional support layer is removed to expose the upper surface of the additional support layer.

After the first electrode 26 is formed, the second support layer 232 and the third support layer 233 no longer need to be fixed by using the sacrificial layer 22. To further construct the capacitor structure, the sacrificial layer 22 needs to be removed to expose a surface of the structure covered by the sacrificial layer 22. For a step of removing the sacrificial layer 22, see step S6.

Figure 6:
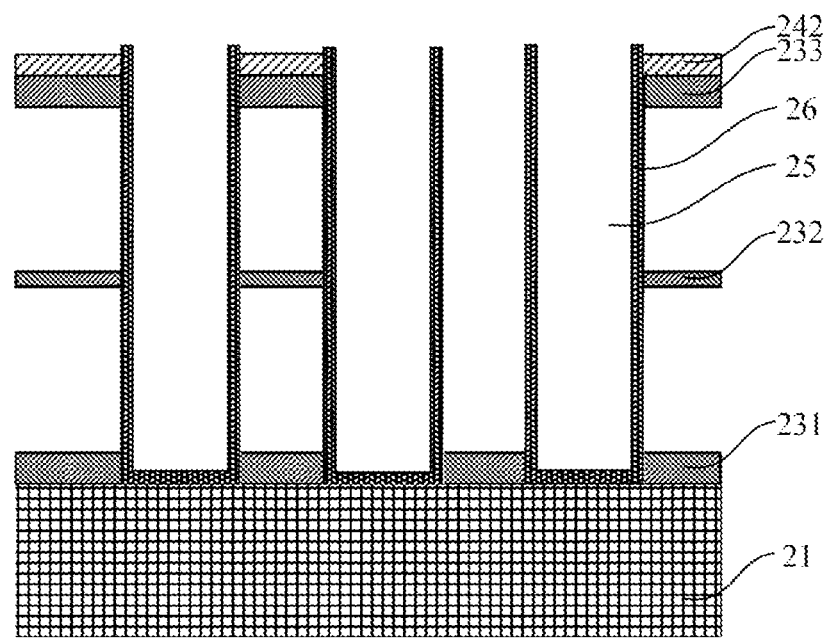
FIG. 6 is a schematic diagram of a structure in which an opening is formed in a patterned mask layer with a preset thickness and a laminated structure and a sacrificial layer is removed according to an embodiment of the present disclosure.

In step S6, the opening that exposes the sacrificial layer 22 is formed in the patterned mask layer 242 with the preset thickness and the laminated structure, and the sacrificial layer 22 is removed based on the opening. As shown in FIG. 6, FIG. 6 is a schematic diagram of a structure in which an opening is formed in the patterned mask layer 242 with the preset thickness and the laminated structure and the sacrificial layer is removed according to an embodiment of the present disclosure.

In an embodiment, forming the opening that exposes the sacrificial layer 22 in the patterned mask layer 242 with the preset thickness and the laminated structure, and removing the sacrificial layer 22 based on the opening may include the following steps.

In S61, a patterned photoresist layer is formed on the upper surface of the patterned mask layer 242 with the preset thickness. The patterned photoresist layer is provided with a plurality of opening patterns, and the opening pattern defines the shape and the position of a first opening.

In S62, the patterned mask layer 242 with the preset thickness and the third support layer 233 are etched based on the patterned photoresist layer to form a second opening that exposes the second sacrificial layer 222; the second sacrificial layer 222 is removed based on the second opening; and a third opening that exposes the first sacrificial layer 221 is formed in the second support layer 232 based on the second opening.

In S63, the first sacrificial layer 221 is removed.

Because the sacrificial layer 22 and the support layer 23 are made of different materials, etching rates of the sacrificial layer 22 and the support layer 23 are different during the same etching process. Specifically, the etching rate of the sacrificial layer 22 is far greater than that of the support layer 23 during the same etching process. Therefore, when the sacrificial layer 22 is completely removed, the support layer 23 is almost completely retained.

In this embodiment, the shape and the position of the first opening is determined by the opening pattern on the patterned photoresist layer. For example, the first opening is circular, and each circular opening overlaps three capacitance holes. Optionally, the first opening may be rectangular, diamond-shaped, or in other shapes. Optionally, the first opening in the patterned photoresist layer may overlap one capacitance hole, or may overlap a plurality of capacitance holes. This is not limited in this embodiment.

Through the foregoing step, the sacrificial layer 22 can be removed while the support layer 23 in the laminated structure is destroyed as little as possible.

In step S7, the capacitor dielectric layer 27 is formed on the surface of the first electrode 26.

Figure 7:
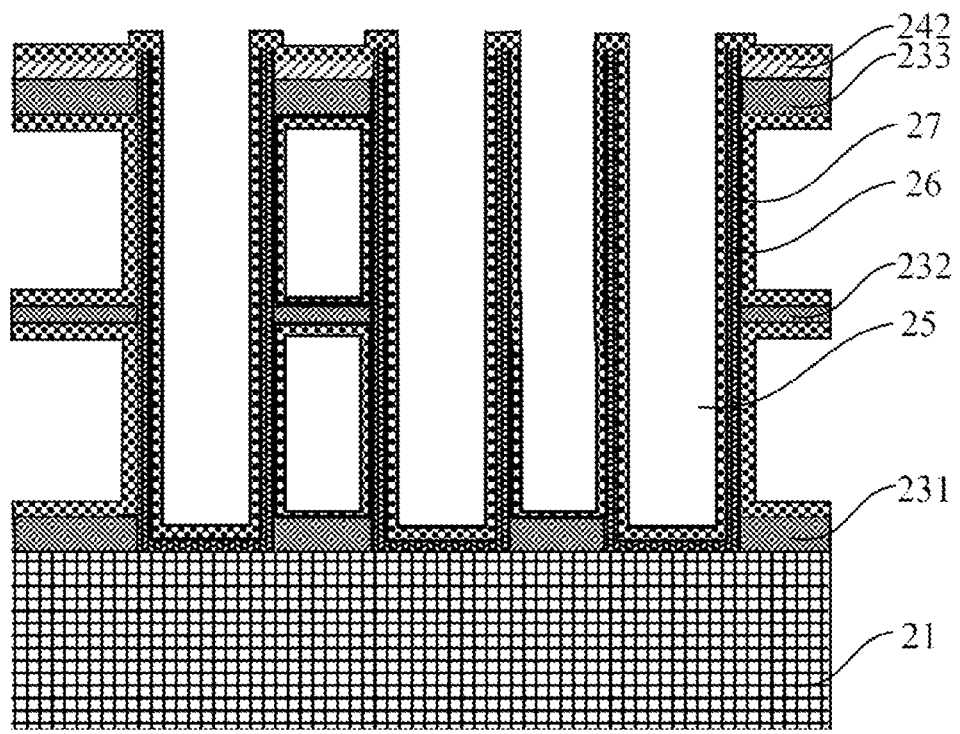
FIG. 7 is a schematic structural diagram of a partial cross section of a capacitor dielectric layer according to an embodiment of the present disclosure.

For example, as shown in FIG. 7, the capacitor dielectric layer 27 covers all exposed surfaces of the structure shown in FIG. 6, including a surface of the support layer 23, the upper surface of the patterned mask layer 242 with the preset thickness and a surface of the first electrode 26.

For example, the capacitor dielectric layer 27 is a high-k dielectric layer, for example, a nitridized oxide silicon layer. The high-k dielectric layer is not only insulating, but also has a higher dielectric constant value. Under the same other conditions, a higher dielectric constant value leads to a higher capacitance.

Figure 8:
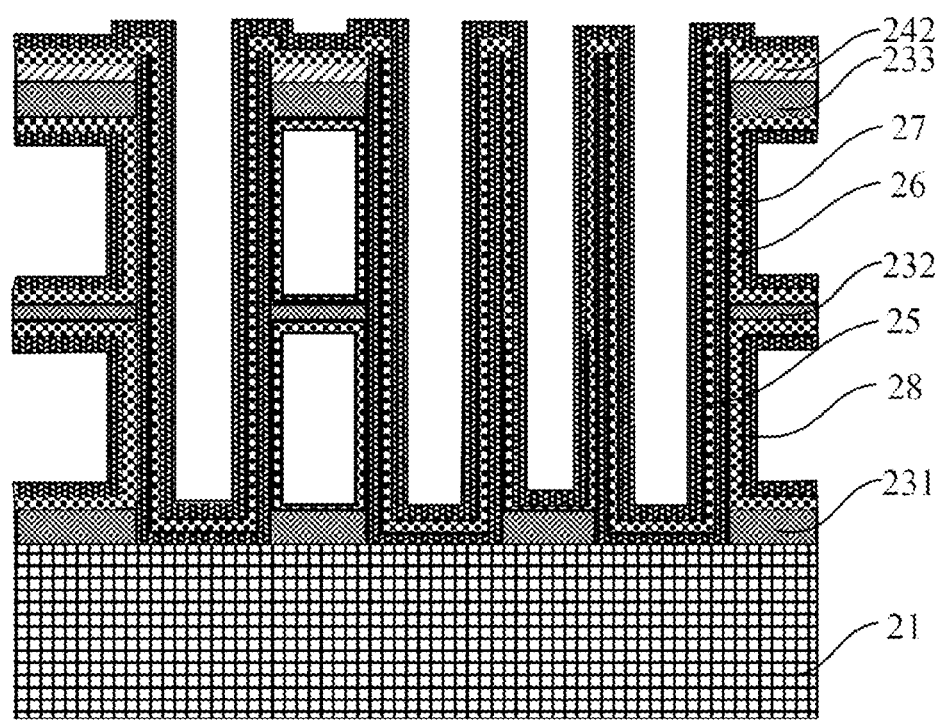
FIG. 8 is a schematic structural diagram of a partial cross section of a second electrode according to an embodiment of the present disclosure.

In step S8, the second electrode 28 is formed on the surface of the capacitor dielectric layer 27. As shown in FIG. 8, the first electrode 26, the second electrode 28 and the capacitor dielectric layer 27 there between jointly form the capacitor structure.

For example, both the first electrode 26 and the second electrode 28 are titanium nitride layers.

According to the method for manufacturing a capacitor array, after the capacitance hole is formed, the patterned mask layer 242 (polysilicon) with the preset thickness is used as an additional support structure. Therefore, an etching process needed for removing the patterned mask layer is eliminated, thereby reducing process steps and lowering the process difficulty. In addition, the hardness advantage of polysilicon is exploited, so that firmness of the support layer 23 and the stability of the capacitor structure are improved. In addition, the patterned mask layer 242 with the preset thickness that is retained can further increase the height of the capacitor structure and the capacitance of the capacitor.

An embodiment of the present disclosure further provides a capacitor array. Referring to FIG. 8 again, the capacitor array includes: a substrate 21; a support structure disposed on the substrate 21, in which the support structure includes a support layer 23 and a patterned mask layer 242 with a preset thickness disposed on an upper surface of the support layer 23; a first electrode 26 disposed in the support structure; a capacitor dielectric layer 27 covering exposed surfaces of the first electrode 26 and the support structure; and a second electrode 28 covering a surface of the capacitor dielectric layer 27.

According to the capacitor array provided in this embodiment, the support structure includes the support layer 23 and the patterned mask layer 242 with the preset thickness disposed on the upper surface of the support layer 23. Therefore, not only can the stability of the capacitor array be improved to prevent the capacitor from being stripped, the added patterned mask layer can further increase a height of the capacitor array and a capacitance of the capacitor.

The substrate 21 includes a memory array structure including a plurality of pads. The memory array structure further includes transistor word lines and bit lines. The pads are electrically connected to a transistor source in the memory array structure. For example, the pads may be arranged in the shape of a hexagonal array. However, the arrangement is not limited to this, and corresponds to that of a subsequently manufactured integrated-circuit capacitor. Specifically, the pads are isolated from each other through spacer layers. The spacer layer may be made of any one or a combination of more than two of silicon nitride (SiN), silicon oxide ($SiO_2$), and aluminum oxide ($Al_2O_3$). In this embodiment, the spacer layer may be made of SiN.

In an embodiment, the support structure includes a first support layer 231, a second support layer 232 and a third support layer 233 that are sequentially arranged at intervals from bottom to top. The patterned mask layer 242 with the preset thickness is located on an upper surface of the third support layer 233. For example, the first support layer 231, the second support layer 232 and the third support layer 233 may be silicon nitride layers or silicon carbonitride layers. The support layers are sequentially arranged at intervals from bottom to top, so that a stable and balanced support structure can be provided for the capacitor array to ensure the stability of the capacitor structure. In addition, the patterned mask layer 242 with the preset thickness in this embodiment is part of the support structure, thereby improving the stability of the capacitor array to prevent the capacitor from being stripped.

In an embodiment, the patterned mask layer 242 with the preset thickness is made of polysilicon. Polysilicon is hard and is part of the support structure. Therefore, the stability of the capacitor array can be greatly improved. Optionally, the preset thickness of the patterned mask layer in the support structure ranges from 150 nm to 250 nm, for example, may be 150 nm, 170 nm, 190 nm, 200 nm, 210 nm, 230 nm or 250 nm.

In an embodiment, a thickness of the third support layer 233 is greater than those of the first support layer 231 and the second support layer 232. For example, the support layers may be made of silicon nitride and/or silicon carbonitride.

In an embodiment, the capacitor dielectric layer 27 may be a high-k dielectric layer, for example, a nitridized oxide silicon layer. The high-k dielectric layer is not only insulating, but also has a higher dielectric constant value. Under the same other conditions, a higher dielectric constant value leads to a higher capacitance.

In an embodiment, both the first electrode 26 and the second electrode 28 are titanium nitride layers.

The present disclosure further provides a memory, including the capacitor array according to any one of the foregoing embodiments.

The technical features of the embodiments can be combined freely. For ease of briefness of description, not all possible combinations of the technical features in the above embodiments are described. However, any combination of these technical features should fall within the scope of this specification, provided that it has no contradiction.

The above-mentioned embodiments only describe several implementations of the present disclosure, and their descriptions are relatively specific and detailed, but they should not be understood as limiting the scope of the present disclosure. It should be noted that those of ordinary skill in the art may further make several improvements and refinements without departing from the principle of the present disclosure, and these improvements and refinements shall fall within the protection scope of the present disclosure. Therefore, the protection scope of the present disclosure shall be subject to that of the claims.

What is claimed is:

1. A method for manufacturing a capacitor array, comprising:
   providing a substrate;
   forming, on an upper surface of the substrate, a laminated structure comprising sacrificial layers and support layers that are alternately laminated;
   forming a patterned mask layer on an upper surface of the laminated structure;
   etching the laminated structure based on the patterned mask layer to form a through hole, wherein after the through hole is formed, the patterned mask layer with a preset thickness is retained on the upper surface of the laminated structure, and the through hole at least penetrates through the patterned mask layer with the preset thickness and the laminated structure in a thickness direction;
   forming a first electrode on a sidewall and at a bottom of the through hole;
   forming, in the patterned mask layer with the preset thickness and the laminated structure, an opening that exposes the sacrificial layers, and removing the sacrificial layers based on the opening;
   forming a capacitor dielectric layer on a surface of the first electrode; and
   forming a second electrode on a surface of the capacitor dielectric layer.

2. The method for manufacturing a capacitor array according to claim 1, wherein a step of forming the laminated structure comprises:
   forming a first support layer of the support layers on the upper surface of the substrate;
   forming a first sacrificial layer of the sacrificial layers on an upper surface of the first support layer;
   forming a second support layer of the support layers on an upper surface of the first sacrificial layer;
   forming a second sacrificial layer of the sacrificial layers on an upper surface of the second support layer; and
   forming a third support layer of the support layers on an upper surface of the second sacrificial layer.

3. The method for manufacturing a capacitor array according to claim 2, wherein when the laminated structure is etched based on the patterned mask layer, an etching selectivity ratio of an etching gas on the first support layer, the second support layer and the third support layer to the etching gas on the patterned mask layer ranges from 3 to 5, and an etching selectivity ratio of the etching gas on the first sacrificial layer and the second sacrificial layer to the etching gas on the patterned mask layer is greater than 10.

4. The method for manufacturing a capacitor array according to claim 3, wherein the etching gas comprises a mixed gas of a fluorine-containing gas and oxygen or a mixed gas of the fluorine-containing gas and hydrogen.

5. The method for manufacturing a capacitor array according to claim 2, wherein a thickness of the third support layer is greater than thicknesses of the first support layer and the second support layer.

6. The method for manufacturing a capacitor array according to claim 1, wherein the patterned mask layer is made of polysilicon.

7. The method for manufacturing a capacitor array according to claim 1, wherein the preset thickness ranges from 150 nm to 250 nm.

8. The method for manufacturing a capacitor array according to claim 2, wherein forming, in the patterned mask layer with the preset thickness and the laminated structure, the opening that exposes the sacrificial layer, and removing the sacrificial layer based on the opening comprises:
   forming a patterned photoresist layer on an upper surface of the patterned mask layer with the preset thickness, wherein the patterned photoresist layer is provided with a plurality of opening patterns, and the plurality of opening patterns define a shape and a position of the opening;
   etching the patterned mask layer with the preset thickness and the third support layer based on the patterned photoresist layer with the preset thickness to form a second opening that exposes the second sacrificial layer; removing the second sacrificial layer based on the second opening; and forming, in the second support layer based on the second opening, a third opening that exposes the first sacrificial layer; and
   removing the first sacrificial layer.

9. The method for manufacturing a capacitor array according to claim 1, wherein the capacitor dielectric layer is a high-k dielectric layer.

10. The method for manufacturing a capacitor array according to claim 1, wherein both the first electrode and the second electrode are titanium nitride layers.

11. A capacitor array, comprising:
   a substrate;
   a support structure disposed on the substrate, wherein the support structure comprises a support layer and a patterned mask layer with a preset thickness disposed on an upper surface of the support layer;

a first electrode disposed in the support structure;

a capacitor dielectric layer covering exposed surfaces of the first electrode and the support structure; and a second electrode covering a surface of the capacitor dielectric layer;

wherein the capacitor array is prepared with steps comprising:

providing the substrate;

forming, on an upper surface of the substrate, a laminated structure comprising sacrificial layers and support layers that are alternately laminated;

forming the patterned mask layer on an upper surface of the laminated structure;

etching the laminated structure based on the patterned mask layer to form a through hole, wherein after the through hole is formed, the patterned mask layer with the preset thickness is retained on the upper surface of the laminated structure, and the through hole at least penetrates through the patterned mask layer with the preset thickness and the laminated structure in a thickness direction;

forming the first electrode on a sidewall and at a bottom of the through hole;

forming, in the patterned mask layer with the preset thickness and the laminated structure, an opening that exposes the sacrificial layers, and removing the sacrificial layers based on the opening;

forming the capacitor dielectric layer on the exposed surface of the first electrode; and forming the second electrode on the surface of the capacitor dielectric layer.

12. The capacitor array according to claim 11, wherein the support structure comprises a first support layer of the support layers, a second support layer of the support layers and a third support layer of the support layers that are sequentially arranged at intervals from bottom to top; and the upper surface of the support layer on which the patterned mask layer with the preset thickness is disposed is an upper surface of the third support layer.

13. The capacitor array according to claim 11, wherein the patterned mask layer with the preset thickness is made of polysilicon.

14. The capacitor array according to claim 11, wherein the preset thickness ranges from 150 nm to 250 nm.

15. The capacitor array according to claim 12, wherein a thickness of the third support layer is greater than thicknesses of the first support layer and the second support layer.

16. The capacitor array according to claim 11, wherein the capacitor dielectric layer comprises a high-k dielectric layer.

17. The capacitor array according to claim 11, wherein both the first electrode and the second electrode are titanium nitride layers.

18. The capacitor array according to claim 12, wherein the first support layer, the second support layer and the third support layer each comprise at least one of a silicon nitride layer or a silicon carbonitride layer.

19. A memory, comprising the capacitor array according to claim 11.

20. The capacitor array according to claim 12, wherein the preset thickness ranges from 150 nm to 250 nm.

* * * * *